United States Patent
Kumar et al.

(10) Patent No.: US 10,261,128 B2
(45) Date of Patent: Apr. 16, 2019

(54) TEST CIRCUIT CAPABLE OF MEASURING PLL CLOCK SIGNAL IN ATPG MODE

(71) Applicant: STMicroelectronics, Inc., Coppell, TX (US)

(72) Inventors: Pramod Kumar, Scottsdale, AZ (US); Vinay Kumar, Scottsdale, AZ (US)

(73) Assignee: STMicroelectronics, Inc., Coppell, TX (US)

(*) Notice: Subject to any disclaimer, the term of this patent is extended or adjusted under 35 U.S.C. 154(b) by 4 days.

(21) Appl. No.: 15/466,001

(22) Filed: Mar. 22, 2017

(65) Prior Publication Data

US 2018/0275197 A1  Sep. 27, 2018

(51) Int. Cl.
*G01R 31/317* (2006.01)
*G01R 31/3177* (2006.01)

(52) U.S. Cl.
CPC ... *G01R 31/31727* (2013.01); *G01R 31/3177* (2013.01); *G01R 31/31701* (2013.01); *G01R 31/31723* (2013.01); *G01R 31/31725* (2013.01)

(58) Field of Classification Search
CPC .................................. G01R 31/31727
See application file for complete search history.

(56) References Cited

U.S. PATENT DOCUMENTS

| | | | | |
|---|---|---|---|---|
| 5,546,406 A | * | 8/1996 | Gillenwater ... | G01B 31/318541 714/727 |
| 6,529,033 B1 | * | 3/2003 | Park ................ | G01R 31/31704 326/16 |
| 6,587,800 B1 | * | 7/2003 | Parker ............. | G01R 31/31725 702/106 |
| 6,665,367 B1 | * | 12/2003 | Blair ............... | G01R 31/31727 324/76.39 |
| 7,129,690 B1 | | 10/2006 | Schmitt et al. | |
| 2006/0026477 A1 | * | 2/2006 | Yeh .................. | F16B 39/24 714/730 |
| 2011/0264971 A1 | * | 10/2011 | Bahl ................ | G01B 31/318594 714/731 |
| 2012/0221906 A1 | * | 8/2012 | Shetty ............. | G01R 31/31855 714/727 |
| 2015/0137862 A1 | * | 5/2015 | Bahl ................ | G01B 31/318552 327/145 |

* cited by examiner

Primary Examiner — Steve N Nguyen
(74) Attorney, Agent, or Firm — Crowe & Dunlevy

(57) ABSTRACT

Disclosed herein is a test circuit for a device under test. The test circuit includes a scan chain configured to receive test pattern data and to shift the test pattern data to the device under test, and being clocked by a reference clock, and a clock circuit configured to operate in either a clock generation mode or a frequency determination mode. The clock circuit, when in the clock generation mode and when the test circuit is in a normal mode of operation, is configured to pass a first clock signal to the device under test. The clock circuit, when in the clock generation mode and when the test circuit is in a test mode of operation, is configured to pass the reference clock to the device under test. The clock circuit, when in the frequency determination mode, counts a frequency of the first clock signal.

29 Claims, 4 Drawing Sheets

TEST CIRCUIT CAPABLE OF MEASURING PLL CLOCK SIGNAL IN ATPG MODE

TECHNICAL FIELD

This disclosure is related to the field of test circuits using automatic test pattern generation (ATPG), and in particular, to a test circuit capable of determining the frequency of a PLL of a device under test in ATPG mode.

BACKGROUND

ATPG (Automatic Test Pattern Generation) is an electronic design automation methodology used to find an input (or test) sequence that, when applied to a digital circuit such as an integrated circuit, enables automatic test equipment (ATE) to distinguish between correct circuit behavior and faulty circuit behavior caused by fabrication defects. The generated patterns are used to test devices after manufacture, or to assist with failure analysis.

Another aspect of digital circuits to test is the frequency of test clock signals generated by clock signal generators, such as phase locked loops. If the actual frequency of a test clock signal generated by a clock signal generator is not the frequency intended to be generated, then the results of the ATPG testing may be incorrect and the test circuitry may malfunction.

Current ATPG circuits are unable to test the frequency of generated test clock signals. Instead, an additional and separate clock monitor circuit is used to test the frequency of generated clock signals. This consumes additional area. In addition, depending on the circuit layout, routing of the generated test clock signals to a separate clock monitor circuit may be difficult.

Accordingly, to eliminate the above drawbacks, development of ATPG circuits capable of testing or verifying the frequency of the test clock signals is desirable.

SUMMARY

Disclosed herein is a test circuit for a device under test. The test circuit includes a scan chain configured to receive test pattern data and to shift the test pattern data to the device under test, and being clocked by a reference clock (slow clock), and a clock circuit configured to operate in either a clock generation mode, such as an OCC (on chip clocking) active mode, or a frequency determination mode. The clock circuit, when in the clock generation (OCC) mode and when the test circuit is in a normal mode of operation, is configured to pass a first clock (fast clock) signal to the device under test. The clock circuit, when in the clock generation mode and when the test circuit is in a test mode of operation, is configured to pass the reference clock to the device under test. The clock circuit, when in the frequency determination mode, counts a frequency of the first clock (fast clock) signal.

The clock circuit, when in the frequency determination mode, may count the frequency of the first clock signal by counting a number of pulses of the first clock signal in a time window equal to a selected number of pulses of the reference clock (slow clock), and when in the clock generation (OCC) mode, may generate a synchronized version of the scan enable signal that is synchronized to the first clock signal.

The clock circuit may include a first multiplexer receiving as input output from the scan chain and a synchronized version of a scan enable signal, a second multiplexer receiving as input output from the second multiplexer and a logic high, and a shift register receiving input from the second multiplexer. The shift register may be clocked by the first clock signal when in the frequency determination mode and may be clocked by the reference clock (slow clock) when in the clock generation (OCC) mode. The second multiplexer may be configured to pass the output from the second->first multiplexer to the shift register when in the frequency determination mode and the synchronized scan enable signal is deasserted, and to otherwise pass the logic high to the shift register. The second multiplexer is configured to pass the output from first multiplexer to the shift register to shift out data to a Scanout output. A synchronize scan control signal is used enable the shift register.

A first flip flop may receive the scan enable signal at its data input and be clocked by the test clock, the first flip flop being configured to generate the synchronized version of the scan enable signal. An inverter may be coupled between the first flip flop and the first multiplexer.

A third multiplexer may receive as input the reference clock and the first clock signal, and provide output to clock the shift register. A first AND gate may receive as input the scan enable signal and a frequency measuring mode signal, and provide a control signal as output to control the first and third multiplexers.

A second flip flop may receive the scan enable signal at its data input and be clocked by the first clock signal. A third flip flop may receive output of the second flip flop at its data input and be clocked by the first clock signal. An inverter may be coupled to receive output of the third flip flop as output, and a second AND gate may receive as input output from the inverter and the frequency measuring mode signal, the second AND gate providing a control signal as output to control the second multiplexer.

A multiplexer may have inputs coupled to outputs of the scan chain and the clock circuit and be configured to pass input received from the scan chain when the clock circuit is in the clock generation (OCC) mode and to pass input received from the clock circuit when the clock circuit is in the frequency determination mode.

The clock circuit includes a first exclusive OR gate receiving as input output from the second multiplexer and a first intermediate signal, and a first clock multiplexer receiving as input output from the first exclusive OR gate and the test pattern data, the first clock multiplexer configured to generate the first intermediate signal. A first clock flip flop may receive output from the first multiplexer at its data input. A first clock AND gate may receive as input output from the first clock flip flop and the test pattern data. A second exclusive OR gate may receive as input output from the first clock AND gate and a second intermediate signal. A second clock multiplexer may receive as input output from the second exclusive OR gate and the first intermediate signal, the second clock multiplexer configured to generate the second intermediate signal.

The clock circuit may include a second clock AND gate receiving as input output from the second clock flip flop and output from the first clock AND gate, a third exclusive OR gate receiving as input output from the second clock AND gate and a third intermediate signal, and a third clock multiplexer receiving as input output from the third exclusive OR gate and the second intermediate signal, the third clock multiplexer configured to generate the third intermediate signal. A third clock AND gate may receive as input output from the third clock flip flop and output from the second clock AND gate.

DETAILED DESCRIPTION

Figure 1:
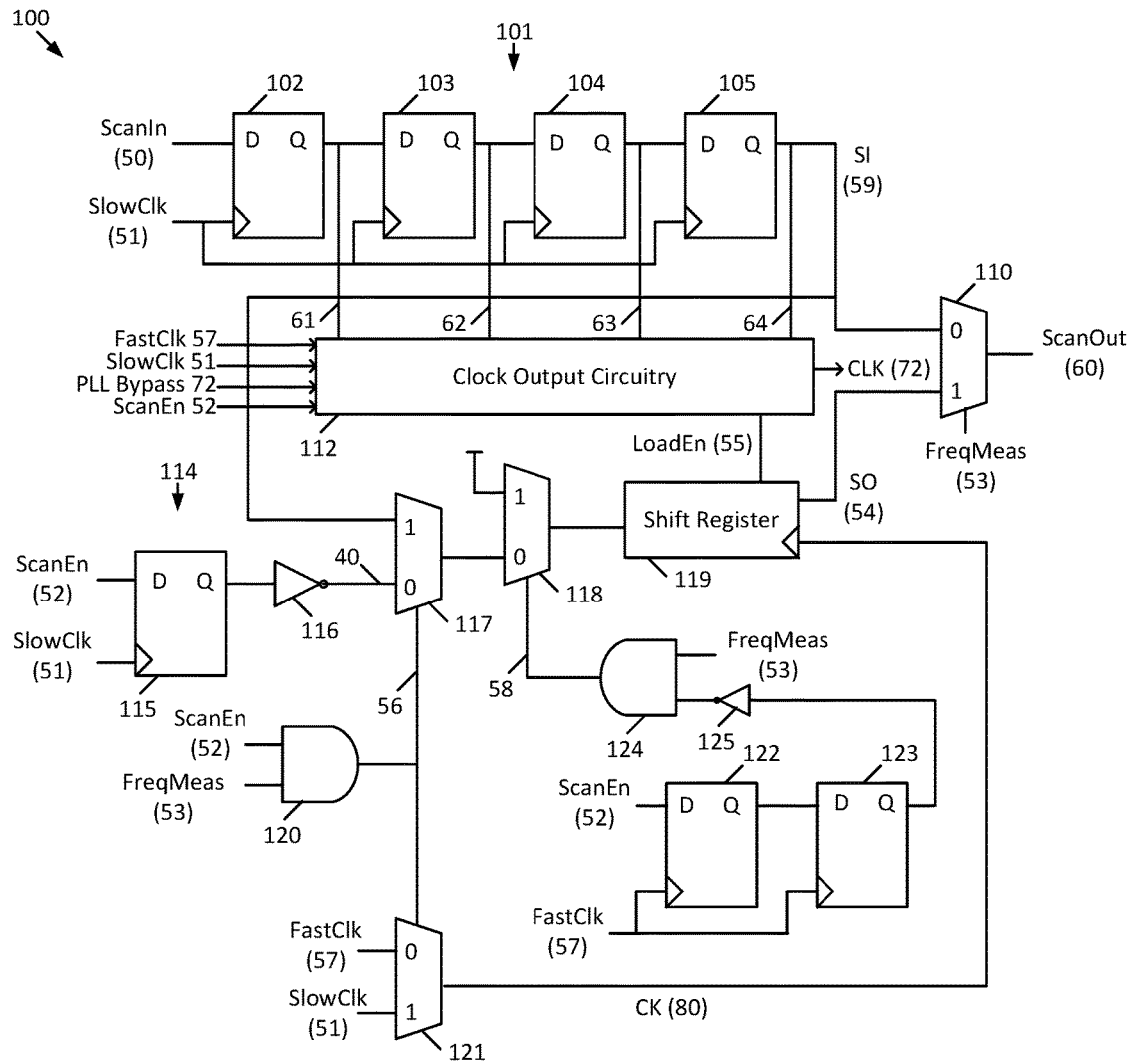
FIG. 1 is a schematic block diagram of a test circuit in accordance with this disclosure.

One or more embodiments of the present disclosure will be described below. These described embodiments are only examples of the presently disclosed techniques. Additionally, in an effort to provide a concise description, all features of an actual implementation may not be described in the specification.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Like reference numbers in the drawing figures refer to like elements throughout.

With reference to FIG. 1, a test circuit 100 for testing a digital circuit, such as an integrated circuit, is now described. The test circuit 100 includes a scan chain 101 configured to receive test pattern data 50 at its input. The scan chain 101 is clocked by a slow clock 51 (reference clock from an external automatic test device), and functions to shift the test pattern data 50 into the digital circuit when in ATPG mode.

The scan chain 101 includes between two and ten, (four in the illustrated example) daisy chained flip flops 102-105. The first flip flop 102 receives the test pattern data (ScanIn) 50 at its data input (D), and each of the flip flops 102-105 is clocked by the slow clock (SlowClk) 51. The data output (Q) of each flip flop is coupled to the data input (D) of a next flip flop in the scan chain 101. The output 59 of the chain 101 is fed to a first input of the multiplexer 110 and a first input of multiplexer 117. The outputs (Q) 61-64 of the flip flops 102-105 of chain 101 are coupled to clock output circuitry 112.

The test circuit 100 also includes a clock circuit 114 configured to operate in either a clock generation mode (OCC) or a frequency determination mode. As will be explained in detail below, the clock circuit 114 operates to pass either the slow clock 51 or a fast clock (FastClk—test clock) 57 when in the clock generation (OCC) mode. However, when in the frequency determination mode, the clock circuit 114 operates to determine the frequency of the fast clock 57. These multiple modes of operation provide the test circuit 100 with functionality not present in conventional designs in that it can not only perform ATPG testing, but also check the frequency of the fast clock 57. This may reduce the area consumed by the test circuit 100, eliminate the use of additional clock monitor circuits, and eliminate extra routing. In addition, this may reduce the length of the test process.

The clock circuit 114 includes flip flop 115 receiving a scan enable signal (ScanEn) 52 at its data input (D) and is clocked by the slow clock 51. Flip flop 115 has an output (Q) coupled to inverter 116, which in turn provides output to a second input of multiplexer 117. Multiplexer 117 also receives the output 59 from flip flop 105 at its first input, provides its output to a second input of a multiplexer 118, and is controlled by control signal 56. Control signal 56 is generated by AND gate 120 which has inputs coupled to receive the scan enable (ScanEn) signal 52 and a frequency measure mode (FreqMeas) signal 53. Multiplexer 121 is also controlled by control signal 56, receives fast clock 57 at its first input, receives slow clock 51 at its second input, and provides an output (CK) 80 that clocks a shift register 119.

Multiplexer 118 has its first input tied to a logic high to enable the shift register 119 and receives output from the multiplexer 117 at its second input, is controlled by control signal 58, and provides its output to the data input of shift register 119. As stated, shift register 119 is clocked by clock signal 80, and provides its output (SO) 54 to the second input of multiplexer 110. Shift register 119 also provides its output to the clock output circuitry 112, in the form of control signal (LoadEn) 55. Multiplexer 110 receives the output 59 of flip flop 105 at its first input, is controlled by the frequency measure mode signal 53, and generates a scan out (ScanOut) signal 60.

The control signal 58 for the multiplexer 118 is generated by the following circuitry. Flip flop 122 receives the scan enable signal 52 at its data input (D) and provides its output (Q) to the data input (D) of daisy chained flip flop 123. Flip flop 123 provides its output (Q) to AND gate 124 through an inverter 125. AND gate 124 receives the frequency measure mode signal 53 at its other input, and generates the control signal 58 at its output. Flip flops 122 and 123 are clocked by fast clock 57. The control signal 58, when at a logic high, serves to enable the shift register 119.

Figure 2:
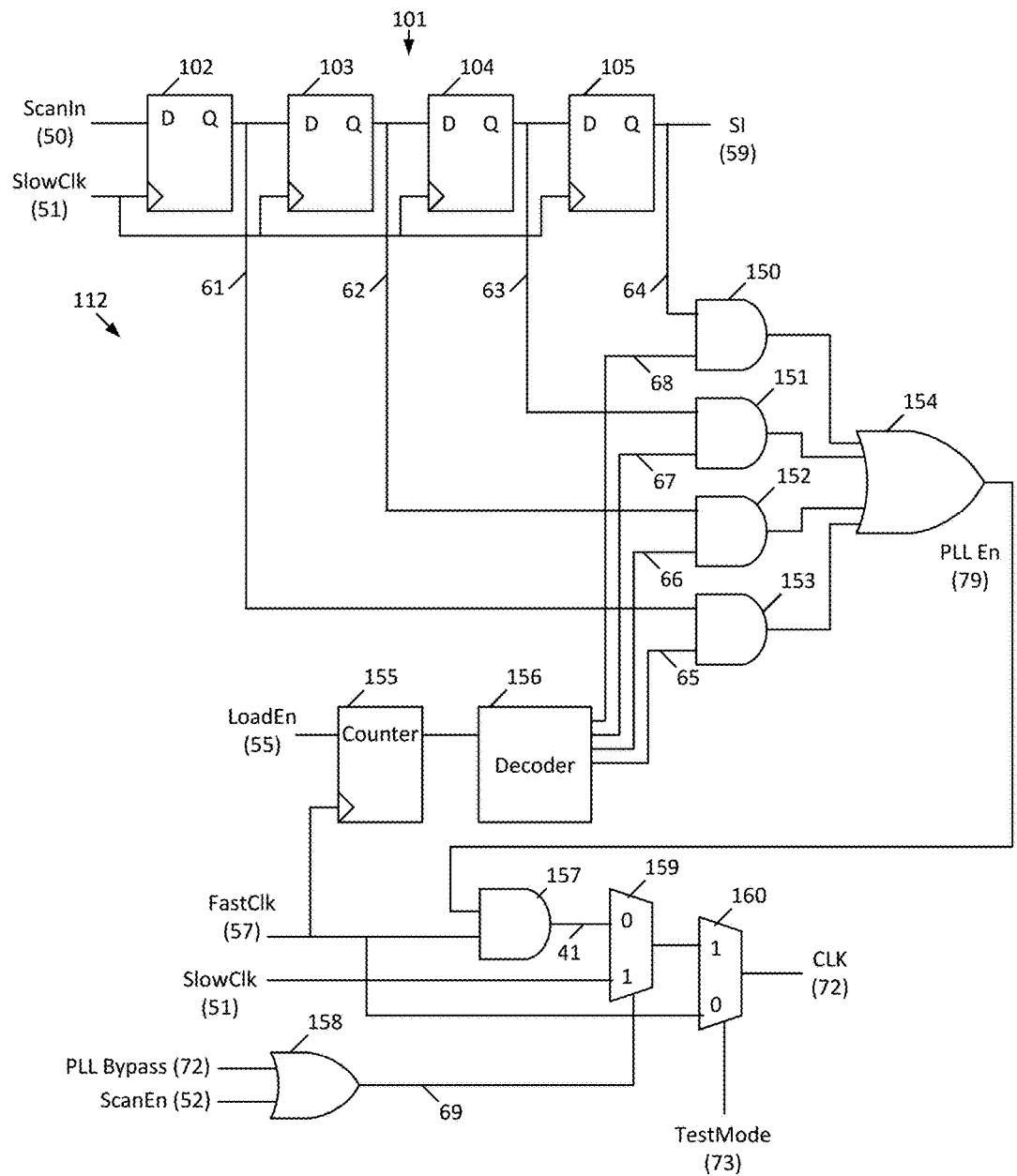
FIG. 2 is a schematic block diagram of the clock output circuitry of FIG. 1.

Referring additionally to FIG. 2, the clock output circuitry 112 is now described. The clock output circuitry 112 includes AND gates 150-153 that respectively receive the outputs 61-64 of the flip flops 102-105 at their first inputs. The AND gates 150-153 also receive outputs 65-68 of a decoder 156 at their second inputs, and provide their outputs to the inputs of an OR gate 154. Decoder 156 receives at its input an output (Q) from flip flop 155. Flip flop 155 receives load enable 55 at its data input (D) and is clocked by fast clock 57. OR gate 154 provides its output (PLL En) 79 to the first input of AND gate 157, which receives fast clock 57 at its second input. AND gate 157 provides its output (Q) to the first input of multiplexer 159, which receives slow clock 51 at its second input and is controlled by control signal 69. OR gate 158 receives a PLL bypass signal 72 and scan enable 52 at its input and generates control signal 69 at its output. Multiplexer 160 receives the output of multiplexer 159 at its first input and fast clock 57 at its second input and is controlled by a test mode signal 73. The clock signal (CLK) 72 for use by the digital circuit being tested is generated at the output of multiplexer 160.

Figure 3:
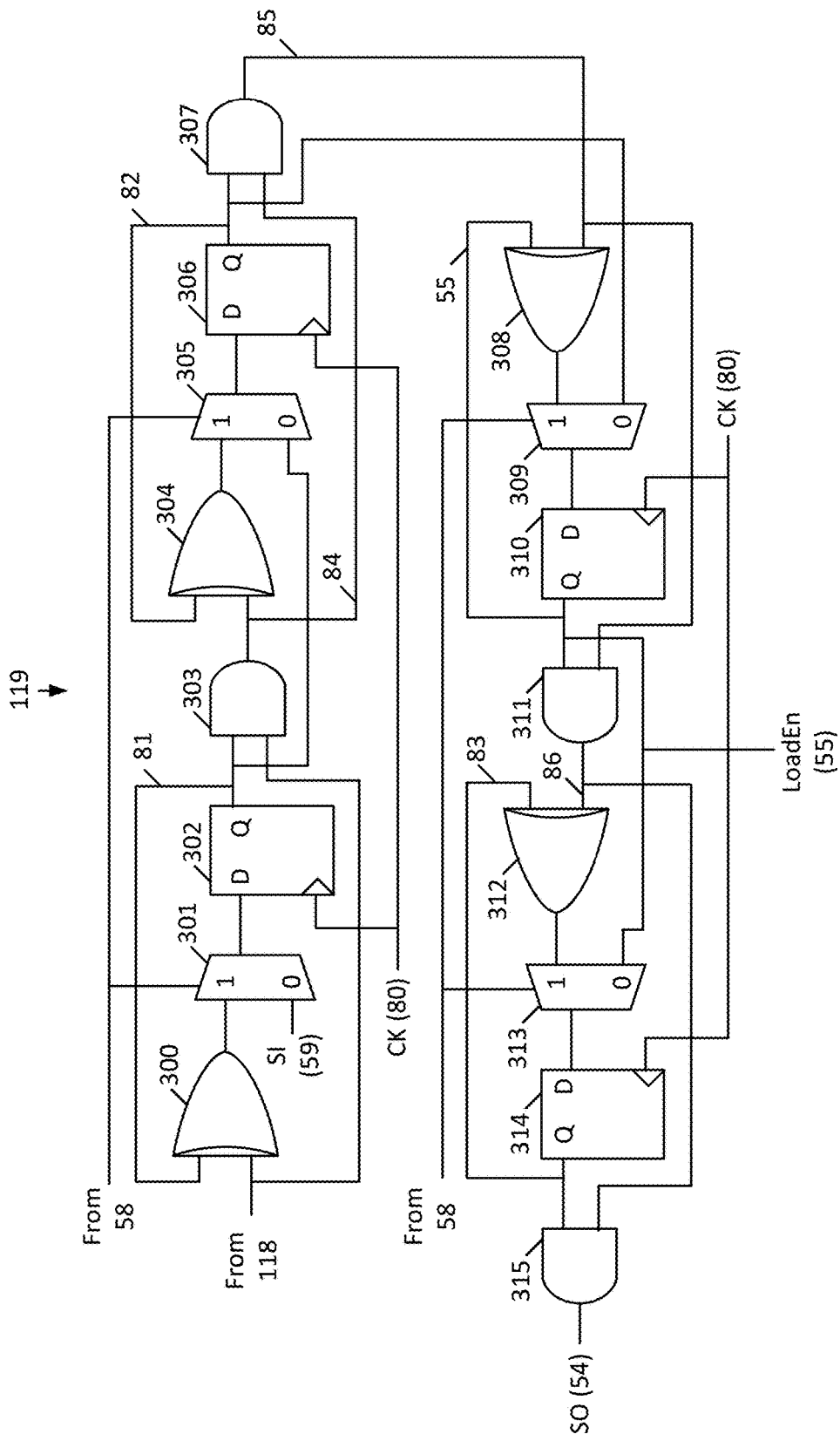
FIG. 3 is a schematic block diagram of the shift register of FIG. 1.

Referring additionally to FIG. 3, the shift register 119 is now described. The shift register 119 includes exclusive OR gate 300 receiving as input the output from multiplexer 118 and intermediate signal 81, and providing output to the first input of multiplexer 301. Multiplexer 301 receives output 59 of flip flop 105 at its second input, and provides its output to the data input (D) of flip flop 302. Flip flop 302 provides its output (Q) as the intermediate signal 81 which is further coupled to the first input of AND gate 303. AND gate 303 receives output 59 from multiplexer 118 at its second input, and provides its output 84 to the second input of exclusive OR gate 304. Exclusive OR gate 304 receives intermediate signal 82 at its first input and provides its output to the first input of multiplexer 305. Multiplexer 305 receives intermediate signal 81 at its second input and provides its output to the data input (D) of flip flop 306.

Flip flop 306 in turn provides its output (Q) as the intermediate signal 82 to the first input of AND gate 307. AND gate 307 receives output 84 from AND gate 303 at its second input, and provides its output 85 to the second input of exclusive OR gate 308. Exclusive OR gate 308 receives intermediate signal 55 at its first input and provides its output to the first input of multiplexer 309. Multiplexer 309 receives intermediate signal 82 at its second input, and provides its output to the data input (D) of flip flop 310, which provides its output (Q) to the first input of AND gate 311 as the load enable signal 55. AND gate 311 receives intermediate signal 85 at its second input and provides its output 86 to the second input of exclusive OR gate 312. Exclusive OR gate 312 receives intermediate signal 83 at its first input, and provides its output to the first input of multiplexer 313. Multiplexer 313 receives the load enable signal 55 at its second input and provides its output to the data input (D) of flip flop 314. Flip flop 314 provides its output (Q) to the first input of AND gate 315. AND gate 315 receives the output 86 of AND gate 311 at its second input, and provides its output (SO) 54 to the multiplexer 110 as explained above.

The multiplexers 301, 305, 309, 313 are controlled by the control signal 58. The flip flops 302, 306, 310, and 314 are clocked by the output (CK) 80 from multiplexer 121.

Operation of the test circuit 100 will now be described with reference to FIGS. 1-3. When the test mode signal 73 goes low, multiplexer 160 passes fast clock 57 as the clock signal (CLK) 72 for use by the digital circuit to be tested. Test operations are not performed when the test mode signal 73 is low, and this mode of operation is thus considered to be a "normal" mode of operation.

When the test circuit 100 is to operate in shift mode, the test mode signal 73 goes high, scan enable 52 goes high, frequency measure mode signal 53 goes low, and PLL bypass 72 goes high. This results in the multiplexer 159 passing slow clock 51 to multiplexer 160, and multiplexer 160 in turn passing slow clock 51 as the test clock (CLK) 72. In this mode, the ATPG pattern is applied as the test pattern data 50, and shifted by the flip flops 102-105 through to multiplexer 110, which in turn passes it as the scan out signal 60.

When the test circuit 100 is to operate in capture mode to test for stuck ATPG, the test mode signal 73 goes high, scan enable 52 goes low, frequency measure mode signal 53 goes low, and PLL bypass 72 goes high. This results in the multiplexer 159 passing slow clock 51 to multiplexer 160, and multiplexer 160 in turn passing slow clock 51 as the test clock (CLK) 72.

When the test circuit 100 is to operate in a transition capture mode, the test mode signal 73 goes high, scan enable 52 goes low, frequency measure mode signal 53 goes low, and PLL bypass 72 goes low. This results in the control signal 56 being low, and in turn the multiplexer 121 passing fast clock to the clock input of the shift register 119. The flip flop 115 synchronizes scan enable 52 to slow clock 51, and the resulting synchronized signal is inverted by the inverter 116 and passed to multiplexer 117. This synchronized and inverted version 40 of scan enable 52 is selected by the multiplexer 117, and passed to multiplexer 118. Since the frequency measure mode signal 53 is low, control signal 58 will be low, and multiplexer 118 will pass the synchronized and inverted 40 version of scan enable 52 to the shift register 119 as its data input. The shift register 119 will pass the synchronized and inverted version 40 of scan enable 52 through as the load enable signal 55. Flip flop 155, clocked by fast clock 57, will pass load enable 55 to decoder 156, which in turn will provide outputs 65-68 to AND gates 150-153. AND gates 150-153 will also receive outputs 61-64 from flip flops 102-105, and provide their respective outputs to OR gate 154, which will generate the PLL enable signal 79, which is received as input by AND gate 157. Since control signal 69 will be low due to PLL bypass 72 and scan enable 52 being low, the output of AND gate 157 will be selected by multiplexer 159 and passed to multiplexer 160. Since test mode 73 is high, multiplexer 160 in turn passes the output 41 of AND gate 157 as the test clock (CLK) 72.

When it is desired for the test circuit 100 to verify the frequency of fast clock 57, the test mode signal 73 goes high, PLL bypass 72 goes low, and the frequency measure mode signal 53 goes high. To capture the fast clock 57, scan enable 52 goes low. This results in the control signal 56 being generated by AND gate 120 as low, resulting in the multiplexer 121 passing the fast clock 54 to the shift register 119 as the clock (CK) 80. This also results in control signal 58 being generated by AND gate 124 as high, resulting in multiplexer 118 passing a logic high to a data input to the shift register 119. Shift register 119 then functions as a counter, counting pulses of fast clock 57 until scan enable 52 transitions to high.

The counting by the shift register 119 is now described with reference to FIG. 3. Initially, prior to the frequency measure mode 53 signal going high, the flip flops 302, 306, 310, and 314 are each set to output a value of zero. Then, after the first pulse of CK 80, the flip flops 302, 306, 310, and 314 are respectively set to output values of 0, 0, 0, and 1. After the second pulse of CK 80, the flip flops 302, 306, 310, and 314 are respectively set to output values of 0, 0, 1, 0. After the third pulse of CK 80, the flip flops 302, 306, 310, and 314 are respectively set to output values of 0, 1, 0, 0. After the fourth pulse of CK 80, the flip flops 302, 306, 310, and 314 are respectively set to output values of 0, 1, 0, 1.

Thus, it can be seen that in the frequency determination mode, the shift register 119 is configured to count by ones—when the frequency measure mode signal 53 is high and the output from multiplexer 118 is high, the shift register 119 acts as a synchronous shift counter that shifts into the input a 1, and the output transitions from 0 to 1 on a fourth clock cycle.

Therefore, the shift register 119 is sized so as to enable counting to a desired number. Thus, although the shift register 119 as illustrated can count to $2^4=16$, it should be understood that it may be sized to count to any desired number. For example, 10 flip flops would enable counting to $2^{10}=1024$.

Figure 4:
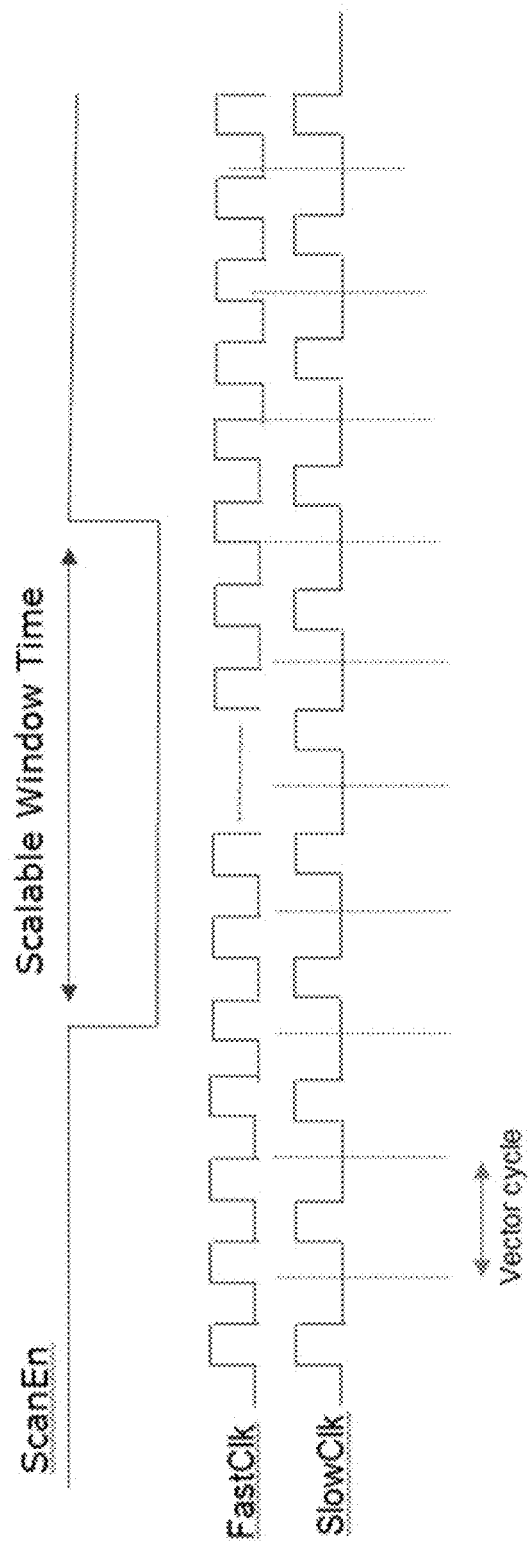
FIG. 4 is a graph showing a time capture window used to determine the frequency of the test clock, such as performed by the shift register of FIG. 3.

By controlling the length of time scan enable 52 is low while the frequency measure mode signal 53 is high, a detection window for fast clock 57 is formed. This window is shown in FIG. 4. By counting the number of pulses of fast clock 57 in the window, the frequency of fast clock 57 can be determined.

In one application, scan enable 52 can be kept low for a given number of pulses of slow clock 51. Here, the frequency of fast clock 57 can be calculated as thus: (Slow Clock Frequency*Number of Pulses of Fast Clock In Window)/Number of Slow Clock Pulses in Window. If slow clock 51 is 25 MHz, scan enable 52 is kept low for three pulses of slow clock 51, and 150 pulses of fast clock 57 were counted in the window, then fast clock 57 can be calculated as (25* 150)/3=1250 MHz.

It should be appreciated that the higher in frequency fast clock 57 is, the smaller the detection window can be.

Likewise, the slower in frequency the fast clock 57 is, the larger the detection window would be.

Once the detection window is closed by scan enable 52 going high, while the test mode signal 73 remains high, PLL bypass 72 remains low, and the frequency measure mode signal 53 remains high, control signal 69 is generated by OR gate 158 as high. This results in multiplexer 159 selecting slow clock 51 to pass to multiplexer 160, which in turn, due to test mode 73 being high, passes slow clock for use as the test clock (CLK) 72. This also results in the control signal 56 being generated as high by AND gate 120, causing multiplexer 121 to pass slow clock 51 to the shift register 119 as its clock signal. Thus, shift register 119 shifts out the counted number of fast clock pulses 57 as signal SO 54 to multiplexer 110, which in turn, due to the frequency measure mode signal 53 being high, passes the signal SO 54 as the scan out signal 60.

It should be understood that there may be any number of test circuits 100, with any number of shift registers 119. In the case where multiple fast clocks are to be tested, they may be tested in parallel using an equal number of shift registers.

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A test circuit for a device under test, the test circuit comprising:
   a scan chain configured to receive test pattern data and to shift the test pattern data to the device under test, and being clocked by a reference clock;
   a clock circuit configured to operate in either a clock generation mode or a frequency determination mode;
   wherein the clock circuit, when in the clock generation mode and when the test circuit is in a normal mode of operation, is configured to pass a first clock signal;
   wherein the clock circuit, when in the clock generation mode and when the test circuit is in a test mode of operation, is configured to pass the reference clock;
   wherein the clock circuit, when in the frequency determination mode, counts a frequency of the first clock signal; and
   a shift register being clocked by output of the clock circuit in both the clock generation mode and the frequency determination mode.

2. The test circuit of claim 1, wherein the clock circuit, when in the frequency determination mode, counts the frequency of the first clock signal by counting a number of pulses of the first clock signal in a time window equal to a selected number of pulses of the reference clock, and when in the clock generation mode, generates a synchronized version of the scan enable signal that is synchronized to the first clock signal.

3. The test circuit of claim 1, wherein the clock circuit comprises:
   a first multiplexer receiving as input output from the scan chain and a synchronized version of a scan enable signal, the synchronized version of the scan enable signal being synchronized to the reference clock;
   a second multiplexer receiving as input output from the first multiplexer and a logic high;
   wherein the shift register receives input from the second multiplexer, the shift register being clocked by the first clock signal when in the frequency determination mode and being clocked by the reference clock when in the clock generation mode; and
   wherein the second multiplexer is configured to pass output from the first multiplexer to the shift register when in the frequency determination mode and the synchronized version of the scan enable signal is deasserted, and otherwise passes the logic high to the shift register.

4. The test circuit of claim 3, further comprising:
   a first flip flop receiving the scan enable signal at its data input and being clocked by the reference clock, the first flip flop being configured to generate the synchronized version of the scan enable signal at its output; and
   a first inverter coupled between the output of first flip flop and the first multiplexer.

5. The test circuit of claim 4, further comprising a third multiplexer receiving as input the reference clock and the first clock signal, and providing output to clock the shift register.

6. The test circuit of claim 5, further comprising a first AND gate receiving as input the scan enable signal and a frequency measuring mode signal, and providing a control signal as output to control the first and third multiplexers.

7. The test circuit of claim 6, further comprising:
   a second flip flop receiving the scan enable signal at its data input and being clocked by the first clock signal;
   a third flip flop receiving output of the second flip flop at its data input and being clocked by the first clock signal;
   a second inverter coupled to receive output of the third flip flop as input; and
   a second AND gate receiving as input output from the second inverter and the frequency measuring mode signal, the second AND gate providing a control signal as output to control the second multiplexer.

8. The test circuit of claim 1, further comprising a multiplexer having inputs coupled to outputs of the scan chain and the shift register and configured to pass input received from the scan chain when the clock circuit is in the clock generation mode and to pass input received from the shift register when the clock circuit is in the frequency determination mode.

9. The test circuit of claim 3, wherein the clock circuit comprises:
   a first exclusive OR gate receiving as input output from the second multiplexer and a first intermediate signal;
   a first clock multiplexer receiving as input output from the first exclusive OR gate and the test pattern data, the first clock multiplexer configured to generate the first intermediate signal;
   a first clock flip flop receiving output from the first multiplexer at its data input;
   a first clock AND gate receiving as input output from the first clock flip flop and the test pattern data;
   a second exclusive OR gate receiving as input output from the first clock AND gate and a second intermediate signal; and
   a second clock multiplexer receiving as input output from the second exclusive OR gate and the first intermediate signal, the second clock multiplexer configured to generate the second intermediate signal.

10. The test circuit of claim 9, wherein the clock circuit further comprises:
    a second clock AND gate receiving as input output from the second clock flip flop and output from the first clock AND gate;

a third exclusive OR gate receiving as input output from the second clock AND gate and a third intermediate signal;
a third clock multiplexer receiving as input output from the third exclusive OR gate and the second intermediate signal, the third clock multiplexer configured to generate the third intermediate signal; and
a third clock AND gate receiving as input output from the third clock flip flop and output from the second clock AND gate.

11. A test circuit comprising:
a first multiplexer receiving as input a first signal and output from a scan chain;
a second multiplexer receiving as input output from the first multiplexer and a logic high; and
a shift register receiving input from the second multiplexer, the shift register being clocked by a first clock signal when in a first mode and being clocked by a reference clock when in a second mode;
wherein the second multiplexer is configured to pass output from the first multiplexer to the shift register when in the first mode and the first signal is deasserted, and otherwise passes the logic high to the shift register.

12. The test circuit of claim 11, further comprising:
a first flip flop receiving a scan enable signal at its data input and being clocked by the reference clock, the first flip flop being configured to generate the first signal as a synchronized version of the scan enable signal at its output, the synchronized version of the scan enable signal being synchronized to the reference clock; and
a first inverter coupled between the first flip flop and the first multiplexer.

13. The test circuit of claim 12, further comprising a third multiplexer receiving as input the reference clock and the first clock signal, and providing output to clock the shift register.

14. The test circuit of claim 13, further comprising a first AND gate receiving as input the scan enable signal and a frequency measuring mode signal, and providing a control signal as output to control the first and third multiplexers.

15. The test circuit of claim 14, further comprising:
a second flip flop receiving the scan enable signal at its data input and being clocked by the first clock signal;
a third flip flop receiving output of the second flip flop at its data input and being clocked by the first clock signal;
a second inverter coupled to receive output of the third flip flop as input; and
a second AND gate receiving as input output from the second inverter and the frequency measuring mode signal, the second AND gate providing a control signal as output to control the second multiplexer.

16. The test circuit of claim 11, wherein the shift register comprises:
a first exclusive OR gate receiving as input output from the second multiplexer and a first intermediate signal;
a first clock multiplexer receiving as input output from the first exclusive OR gate and test pattern data, the first clock multiplexer configured to generate the first intermediate signal;
a first clock flip flop receiving output from the first multiplexer at its data input; and
a first clock AND gate receiving as input output from the first clock flip flop and the test pattern data.

17. The test circuit of claim 16, wherein the shift register further comprises:

a second exclusive OR gate receiving as input output from the first clock AND gate and a second intermediate signal;
a second clock multiplexer receiving as input output from the second exclusive OR gate and the first intermediate signal, the second clock multiplexer configured to generate the second intermediate signal; and
a second clock AND gate receiving as input output from the second clock flip flop and output from the first clock AND gate.

18. The test circuit of claim 17, wherein the shift register further comprises:
a third exclusive OR gate receiving as input output from the second clock AND gate and a third intermediate signal;
a third clock multiplexer receiving as input output from the third exclusive OR gate and the second intermediate signal, the third clock multiplexer configured to generate the third intermediate signal; and
a third clock AND gate receiving as input output from the third clock flip flop and output from the second clock AND gate.

19. A test circuit for a device under test, the test circuit comprising:
a scan chain configured to receive test pattern data and to shift the test pattern data to the device under test, and being clocked by a reference clock;
a clock circuit configured to operate in either a clock generation mode or a frequency determination mode;
wherein the clock circuit, when in the clock generation mode and when the test circuit is in a normal mode of operation, is configured to pass a first clock signal;
wherein the clock circuit, when in the clock generation mode and when the test circuit is in a test mode of operation, is configured to pass the reference clock;
wherein the clock circuit, when in the frequency determination mode, counts a frequency of the first clock signal; and
a multiplexer having inputs coupled to outputs of the scan chain and a shift register and configured to pass input received from the scan chain when the clock circuit is in the clock generation mode and to pass input received from the shift register when the clock circuit is in the frequency determination mode.

20. The test circuit of claim 19, wherein the clock circuit comprises:
a first multiplexer receiving as input output from the scan chain and a synchronized version of a scan enable signal, the synchronized version of the scan enable signal being synchronized to the reference clock;
a second multiplexer receiving as input output from the first multiplexer and a logic high;
wherein the shift register receives input from the second multiplexer, the shift register being clocked by the first clock signal when in the frequency determination mode and being clocked by the reference clock when in the clock generation mode; and
wherein the second multiplexer is configured to pass output from the first multiplexer to the shift register when in the frequency determination mode and the synchronized version of the scan enable signal is deasserted, and otherwise passes the logic high to the shift register.

21. The test circuit of claim 20, further comprising:
a first flip flop receiving the scan enable signal at its data input and being clocked by the reference clock, the first flip flop being configured to generate the synchronized version of the scan enable signal at its output; and a first inverter coupled between the output of first flip flop and the first multiplexer.

22. The test circuit of claim 21, further comprising a third multiplexer receiving as input the reference clock and the first clock signal, and providing output to clock the shift register.

23. The test circuit of claim 22, further comprising a first AND gate receiving as input the scan enable signal and a frequency measuring mode signal, and providing a control signal as output to control the first and third multiplexers.

24. The test circuit of claim 23, further comprising:
a second flip flop receiving the scan enable signal at its data input and being clocked by the first clock signal;
a third flip flop receiving output of the second flip flop at its data input and being clocked by the first clock signal;
a second inverter coupled to receive output of the third flip flop as input; and
a second AND gate receiving as input output from the second inverter and the frequency measuring mode signal, the second AND gate providing a control signal as output to control the second multiplexer.

25. A test circuit for a device under test, the test circuit comprising:
a scan chain configured to receive test pattern data and to shift the test pattern data to the device under test, and being clocked by a reference clock;
a clock circuit configured to operate in either a clock generation mode or a frequency determination mode;
wherein the clock circuit, when in the clock generation mode and when the test circuit is in a normal mode of operation, is configured to pass a first clock signal;
wherein the clock circuit, when in the clock generation mode and when the test circuit is in a test mode of operation, is configured to pass the reference clock;
wherein the clock circuit, when in the frequency determination mode, counts a frequency of the first clock signal; and
wherein the clock circuit comprises:
a first multiplexer receiving as input output from the scan chain and a synchronized version of a scan enable signal, the synchronized version of the scan enable signal being synchronized to the reference clock;
a second multiplexer receiving as input output from the first multiplexer and a logic high;
wherein a shift register receives input from the second multiplexer, the shift register being clocked by the first clock signal when in the frequency determination mode and being clocked by the reference clock when in the clock generation mode; and
wherein the second multiplexer is configured to pass output from the first multiplexer to the shift register when in the frequency determination mode and the synchronized version of the scan enable signal is deasserted, and otherwise passes the logic high to the shift register.

26. The test circuit of claim 25, further comprising:
a first flip flop receiving the scan enable signal at its data input and being clocked by the reference clock, the first flip flop being configured to generate the synchronized version of the scan enable signal at its output; and
a first inverter coupled between the output of first flip flop and the first multiplexer.

27. The test circuit of claim 26, further comprising a third multiplexer receiving as input the reference clock and the first clock signal, and providing output to clock the shift register.

28. The test circuit of claim 27, further comprising a first AND gate receiving as input the scan enable signal and a frequency measuring mode signal, and providing a control signal as output to control the first and third multiplexers.

29. The test circuit of claim 28, further comprising:
a second flip flop receiving the scan enable signal at its data input and being clocked by the first clock signal;
a third flip flop receiving output of the second flip flop at its data input and being clocked by the first clock signal;
a second inverter coupled to receive output of the third flip flop as input; and
a second AND gate receiving as input output from the second inverter and the frequency measuring mode signal, the second AND gate providing a control signal as output to control the second multiplexer.

* * * * *